United States Patent
Yoshida

(10) Patent No.: US 9,593,261 B2
(45) Date of Patent: Mar. 14, 2017

(54) POLISHING AGENT, POLISHING METHOD, AND LIQUID ADDITIVE FOR POLISHING

(71) Applicant: ASAHI GLASS COMPANY, LIMITED, Chiyoda-ku (JP)

(72) Inventor: Yuiko Yoshida, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 15/014,296

(22) Filed: Feb. 3, 2016

(65) Prior Publication Data
US 2016/0222253 A1 Aug. 4, 2016

(30) Foreign Application Priority Data

Feb. 4, 2015 (JP) ................... 2015-019935
Oct. 30, 2015 (JP) ................... 2015-213883

(51) Int. Cl.
| | |
|---|---|
| *C09G 1/02* | (2006.01) |
| *H01L 21/3105* | (2006.01) |
| *H01L 21/306* | (2006.01) |
| *C09K 13/00* | (2006.01) |
| *C09K 3/14* | (2006.01) |

(52) U.S. Cl.
CPC .......... *C09G 1/02* (2013.01); *H01L 21/31053* (2013.01); *C09K 3/1463* (2013.01); *C09K 13/00* (2013.01); *H01L 21/30625* (2013.01)

(58) Field of Classification Search
CPC ............... C09G 1/02; H01L 21/31053; H01L 21/30625; C09K 13/00; C09K 3/1463
See application file for complete search history.

(56) References Cited

U.S. PATENT DOCUMENTS

| | | | | |
|---|---|---|---|---|
| 2005/0029491 | A1* | 2/2005 | Liu | H01L 21/3212 252/79.1 |
| 2005/0095860 | A1* | 5/2005 | Uchida | C09G 1/02 438/689 |
| 2005/0194562 | A1* | 9/2005 | Lavoie, Jr. | C09G 1/02 252/79.1 |
| 2007/0181534 | A1* | 8/2007 | Kamimura | B24B 37/044 216/88 |
| 2007/0218811 | A1 | 9/2007 | Kurata et al. | |
| 2009/0093118 | A1* | 4/2009 | Uotani | B24B 37/044 438/692 |
| 2011/0207327 | A1* | 8/2011 | Suzuki | C09G 1/02 438/693 |
| 2012/0270399 | A1* | 10/2012 | Shin | C09G 1/02 438/692 |
| 2015/0014579 | A1* | 1/2015 | Miwa | H01L 21/02024 252/79.5 |

FOREIGN PATENT DOCUMENTS

WO WO 2006/035771 A1 4/2006

\* cited by examiner

*Primary Examiner* — Anita Alanko
(74) *Attorney, Agent, or Firm* — Oblon, McClelland, Maier & Neustadt, L.L.P.

(57) ABSTRACT

The present invention relates to a polishing agent including: cerium oxide particles; a water-soluble organic polymer having at least one selected from a carboxylic acid group and a salt of carboxylic acid; a water-soluble polyamide having at least one selected from a tertiary amino group and an oxyalkylene chain in a molecule thereof; and water, in which the polishing agent has a pH of 7 or less.

16 Claims, 2 Drawing Sheets

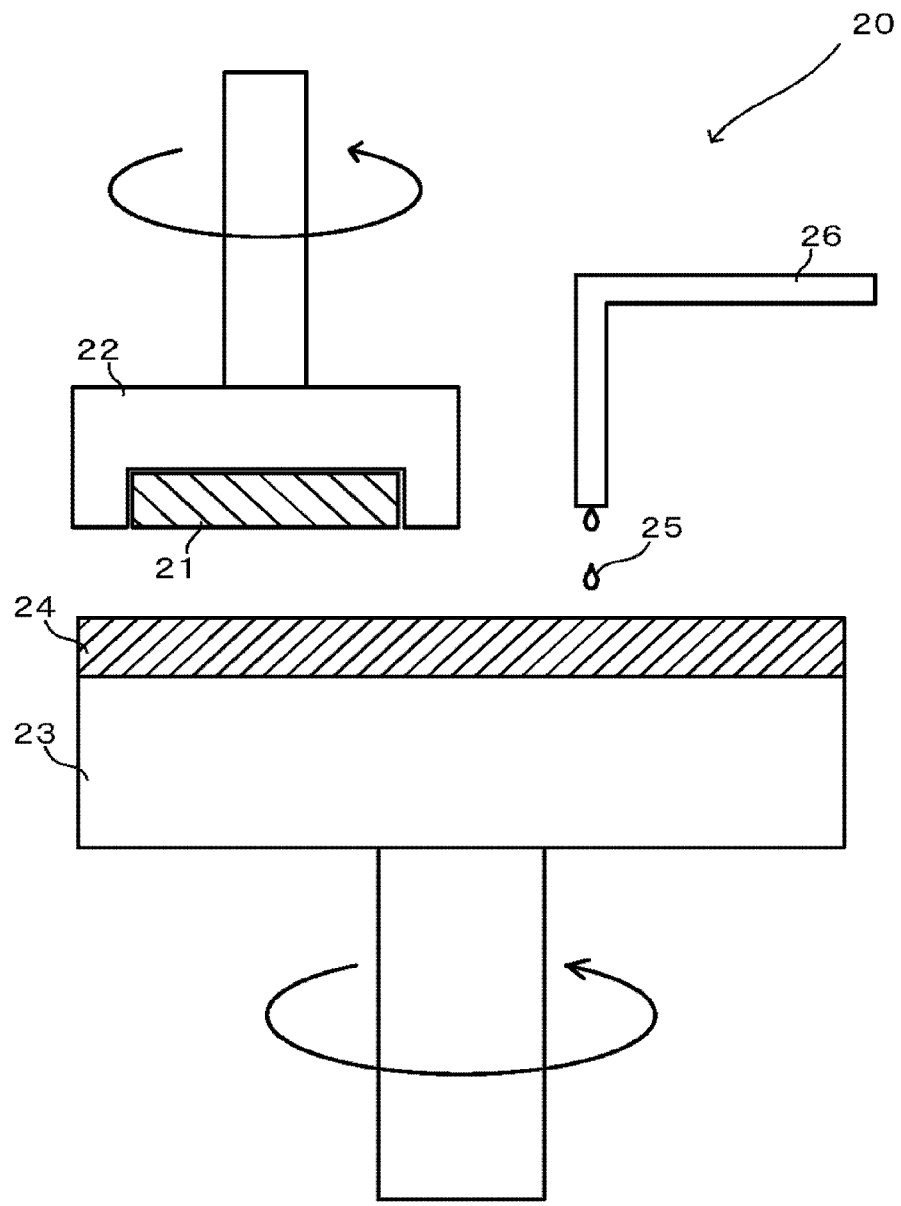

US 9,593,261 B2

1

POLISHING AGENT, POLISHING METHOD, AND LIQUID ADDITIVE FOR POLISHING

FIELD OF THE INVENTION

The present invention relates to a polishing agent, a polishing method, and a liquid additive for polishing. Particularly, the present invention relates to a polishing agent for chemical mechanical polishing in the manufacturing of a semiconductor integrated circuit, a polishing method using the polishing agent, and a liquid additive for polishing, for preparing the polishing agent.

BACKGROUND OF THE INVENTION

In recent years, with high integration and high functionality of a semiconductor integrated circuit, the development of microfabrication technology for miniaturization and density growth of a semiconductor element is advancing. In the manufacturing of a semiconductor integrated circuit device (hereinafter also referred to as a "semiconductor device"), in order to prevent the problem such that unevenness (difference in level) of the surface of a layer exceeds depth of focus of lithography and sufficient resolution is not obtained, it is conventionally performed to flatten an interlayer insulating film, an embedding wiring and the like using chemical mechanical polishing (hereinafter referred to as "CMP"). Importance of high flattening by CMP is increasing with severer requirements of high definition and miniaturization of an element.

Furthermore, in recent years, in the manufacturing of a semiconductor device, an isolation method by shallow trench having small element isolation width (Shallow Trench Isolation; hereinafter referred to as "STI") is introduced in order to proceed with higher miniaturization of a semiconductor element.

The STI is a technique for forming an electrically insulated element region by forming a trench (groove) on a silicon substrate and embedding an insulating film in the trench. In the STI, as shown in FIG. 1A, an element region of a silicon substrate 1 is masked with a silicon nitride film 2 or the like, a trench 3 is formed on the silicon substrate 1, and an insulating film such as a silicon dioxide film 4 is then deposited so as to embed the trench 3. The silicon dioxide film 4 on the silicon nitride film 2 as a convex part is polished and removed by CMP while remaining the silicon dioxide film 4 in the trench 3 as a concave part. Thus, an element isolation structure having the silicon dioxide film 4 embedded in the trench 3 is obtained as shown in FIG. 1B.

It is desirable in CMP in the STI that the upper surface of the silicon dioxide film 4 in the trench 3 as a concave part is flush with the upper surface of the silicon nitride film 2 as a convex part. When the degree of the flushness between the upper surface of the silicon dioxide film 4 and the upper surface of the silicon nitride film 2 is defined as flatness, a distance along a thickness (or height) direction of from the upper surface of the silicon nitride film 2 before polishing to the upper surface of the silicon dioxide film 4 as a concave part after polishing (hereinafter simply referred to as a "distance") can provide an index showing flatness. The upper surface of the silicon dioxide film 4 as a convex part is nearly flush with the upper surface of the silicon nitride film 2, and those films are arranged on the surface having substantially same height and flatness is satisfactory, as the distance is short.

In CMP technology in recent years, not only satisfactory flatness (high flatness) but also high removal rate to a silicon

2 dioxide film is required from the standpoint of cost, and both high removal rate and high flatness are required.

In view of the above standpoint, a method for improving polishing characteristics of a polishing agent is proposed. Patent Document 1 discloses a CMP polishing agent for flattening an interlayer insulation film, an insulating film for STI, or the like, the polishing agent including cerium oxide particles, a dispersant, a polycarboxylic acid having a weight average molecular weight of from 500 to 20,000, a strong acid (sulfuric acid) with a first dissociative acid group having a pKa value of 3.2 or less, and water, and having a pH of from 4.0 to 7.5.

However, in the polishing agent disclosed in Patent Document 1, flatness of a substrate obtained by polishing is satisfactory, but it did not say that removal rate to a silicon dioxide film is sufficiently high.

Patent Document 1: WO 2006/035771

SUMMARY OF THE INVENTION

The present invention has been made to solve the above-described problems, and has an object to provide a polishing agent and a polishing method that can achieve sufficiently high removal rate to a silicon oxide film such as a silicon dioxide film while securing satisfactory flatness.

A polishing agent of the present invention includes: cerium oxide particles; a water-soluble organic polymer having at least one selected from a carboxylic acid group and a salt of carboxylic acid; a water-soluble polyamide having at least one selected from a tertiary amino group and an oxyalkylene chain in a molecule thereof; and water, and has a pH of 7 or less.

In the polishing agent of the present invention, it is preferable that the water-soluble polyamide has the tertiary amino group in at least one selected from a main chain and a side chain thereof. It is preferable that the water-soluble polyamide has the oxyalkylene chain in the main chain thereof. It is preferable that the water-soluble polyamide is a copolymer obtained from at least one selected from aminoethyl piperazine and a modified polyalkylene glycol, and a lactam. It is preferable that the water-soluble organic polymer contains at least one selected from polyacrylic acid and ammonium polyacrylate. It is preferable that the water-soluble organic polymer has a weight average molecular weight of from 1,000 to 50,000.

It is preferable that the water-soluble polyamide is contained in an amount of from 0.00005 to 0.01 mass % based on a total amount of the polishing agent. It is preferable that the water-soluble organic polymer is contained in an amount of from 0.01 to 0.5 mass % based on the total amount of the polishing agent. It is preferable that the polishing agent has the pH of from 4 to 6.5. It is preferable that the cerium oxide particles have an average secondary particle size of from 0.01 to 0.5 μm. It is preferable that the cerium oxide particles are contained in an amount of from 0.05 to 2 mass % based on the total amount of the polishing agent.

A polishing method of the present invention is a polishing method including: bringing a polishing pad into contact with a surface to be polished while supplying a polishing agent to perform polishing by relative movement therebetween, in which the surface to be polished including a surface comprising silicon oxide of a semiconductor substrate is polished using the polishing agent of the present invention.

A liquid additive for polishing of the present invention is a liquid additive for preparing a polishing agent by mixing with a dispersion of cerium oxide particles, the liquid additive including: a water-soluble organic polymer having at least one selected from a carboxylic acid group and a salt of carboxylic acid; a water-soluble polyamide having at least one selected from a tertiary amino group and an oxyalkylene chain in a molecule thereof; and water, and having a pH of 7 or less.

In the liquid additive for polishing of the present invention, it is preferable that the water-soluble polyamide has at least one selected from: the tertiary amino group bonded to at least one selected from a main chain or a side chain thereof; and the oxyalkylene chain bonded to the main chain thereof. It is preferable that the water-soluble polyamide is a copolymer obtained from at least one selected from aminoethyl piperazine and a modified polyalkylene glycol, and a lactam. It is preferable that the water-soluble organic polymer contains at least one selected from polyacrylic acid and ammonium polyacrylate.

In the present invention, the term "surface to be polished" is a surface to be polished of an object to be polished, and means, for example, the surface. In the present specification, a surface in an intermediate stage appearing on a semiconductor substrate in the process of manufacturing a semiconductor device is also included in the "surface to be polished".

In the present invention, "silicon oxide" is specifically silicon dioxide, but the invention is not limited to only silicon dioxide, and includes silicon oxide other than silicon dioxide.

The term "water-soluble" means a property of being dissolved in water at ordinary temperatures.

According to the polishing agent and the polishing method of the present invention, high removal rate to a silicon oxide film can be achieved while maintaining sufficiently high flatness, for example, in CMP of a surface to be polished which includes a surface including silicon oxide.

BRIEF DESCRIPTION OF THE DRAWING

FIG. 2 is a view showing one example of a polishing machine usable in the polishing method of the present invention.

DETAILED DESCRIPTION OF THE INVENTION

Figure 1A:
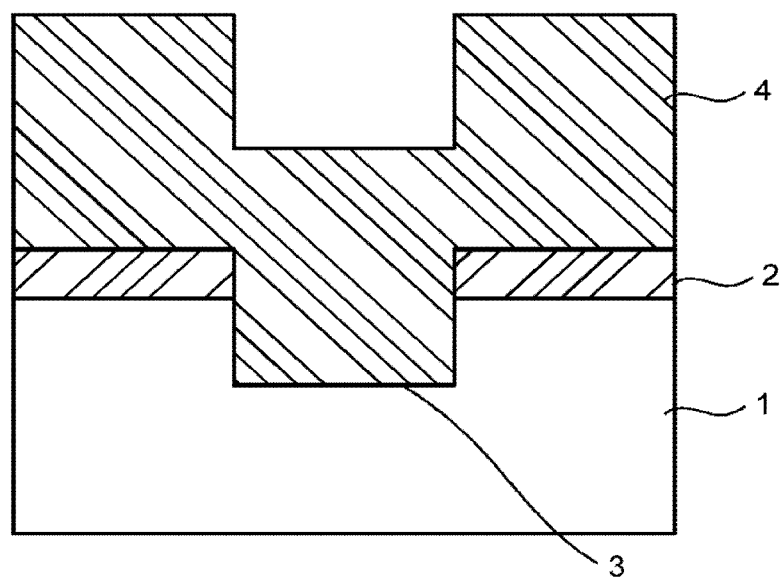
FIGS. 1A and 1B are cross-sectional views of a semiconductor substrate showing a polishing method by CMP in STI.
Figure 1B:
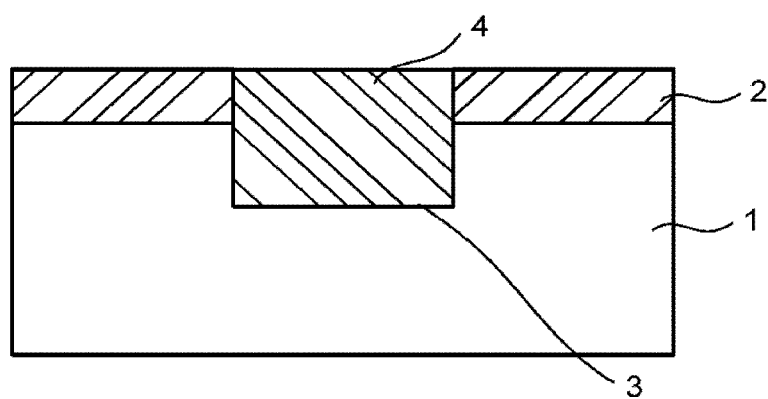

An embodiment of the present invention is described below. However, the present invention is not limited to the following embodiment, and other embodiments can be included in the scope of the present invention so long as those conform to the gist of the present invention.
Polishing Agent The polishing agent of the present invention includes cerium oxide particles, a water-soluble organic polymer having a carboxylic acid group and/or a salt of carboxylic acid, a water-soluble polyamide having a tertiary amino group and/or an oxyalkylene chain in the molecule thereof, and water, and has a pH of 7 or less.

When the polishing agent of the present invention is used in, for example, CMP of a surface to be polished which includes a surface including silicon oxide, high removal rate to a silicon oxide film can be achieved while maintaining sufficiently high flatness.

The mechanism that the polishing agent of the present invention exhibits such excellent polishing characteristics is not clear, but it is considered to be due to that the polishing agent contains a water-soluble organic polymer having a carboxylic acid group and/or a salt of carboxylic acid, and a water-soluble polyamide having a tertiary amino group and/or an oxyalkylene chain in the molecule thereof. That is, it is considered to be due to that the water-soluble organic polymer having a carboxylic acid group and/or a salt of carboxylic acid and the water-soluble polyamide having a tertiary amino group and/or an oxyalkylene chain in the molecule thereof, contained in the polishing agent are electrostatically adsorbed on the surface of the cerium oxide particles and the surface to be polished including the silicon oxide film through terminal groups of the respective molecules in the pH region of 7 or less. It is considered that the effect of adsorption of the water-soluble organic polymer and water-soluble polyamide on the surface of cerium oxide particles and the effect of adsorption of those on the surface to be polished including the silicon oxide film are optimized, and as a result, both high removal rate to the silicon oxide film and high flatness can be achieved without impairing dispersibility of cerium oxide particles in polishing slurry.

Each component contained in the polishing agent of the present invention and a pH of slurry are described below.
Cerium Oxide Particles The cerium oxide particles contained in the polishing agent of the present invention have a function as abrasives for polishing. Although the kind of the cerium oxide particles is not particularly limited, cerium oxide particles produced by the method described in, for example, JP-A-11-12561 or JP-A-2001-35818 can be used. Specifically, the present invention can use cerium oxide particles obtained by adding an alkali to a cerium nitrate (IV) ammonium aqueous solution to prepare a cerium hydroxide gel, followed by filtering, cleaning and calcining, or cerium oxide particles obtained by pulverizing high purity cerium carbonate, and then calcining, followed by further pulverizing and classifying. Cerium oxide particles obtained by chemically oxidizing cerium (III) salt in a liquid, as described in JP-T-2010-505735, also can be used.

The cerium oxide particles have an average particle size of preferably from 0.01 to 0.5 µm, and more preferably from 0.03 to 0.3 µm. In case where the average particle size thereof exceeds 0.5 µm, polishing flaws such as scratches are likely to be generated on the surface to be polished. On the other hand, in case where the average particle size thereof is less than 0.01 µm, removal rate is likely to be decreased. Additionally, since a percentage of a surface area per unit volume is large, influence of surface state is easy to be received, and cerium oxide particles become easy to aggregate depending on the conditions such as a pH and a concentration of an additive.

The cerium oxide particles are present as aggregates (secondary particles) in which primary particles have been aggregated in a liquid. Therefore, the preferred average particle size of the cerium oxide particles described above is represented by an average secondary particle size. Specifically, the cerium oxide particles have an average secondary particle size of preferably from 0.01 to 0.5 µm, and more preferably from 0.03 to 0.3 µm.

The average secondary particle size is measured with a particle size analyzer of laser diffraction/scattering type or the like using a dispersion having particles dispersed in a dispersion medium such as pure water.

The content (content ratio or concentration) of the cerium oxide particles is preferably from 0.05 to 2.0 mass % based on the total amount of the polishing agent. Particularly preferred content thereof is from 0.15 to 0.5 mass %. When the content of the cerium oxide particles is from 0.05 to 2.0 mass %, sufficiently high removal rate to a silicon oxide film can be obtained. Additionally, since a viscosity of the polishing agent is not so high, handling properties are satisfactory.

Cerium oxide particles in the state of previously being dispersed in a medium may be used as the cerium oxide particles of the present invention. In such a case, the medium is preferably water.

Water

Water is contained in the polishing agent of the present invention as a medium for dispersing cerium oxide particles and for dissolving a water-soluble organic polymer and water-soluble polyamide described hereinafter. The kind of water is not particularly limited, but considering the influence to the water-soluble organic polymer and water-soluble polyamide, prevention of contamination by impurities, the influence to pH and the like, pure water, ultrapure water, ion-exchanged water and the like are preferably used.

Water-Soluble Organic Polymer

The water-soluble organic polymer contained in the polishing agent of the present invention is a polymer having at least one selected from a carboxylic acid group and a salt of carboxylic acid. Specific examples of the water-soluble organic polymer having a carboxylic acid group and/or a salt of carboxylic acid include a homopolymer of a monomer having a carboxylic acid group, such as acrylic acid, methacrylic acid or maleic acid, and a homopolymer in which a moiety of the carboxylic acid group of the above-mentioned polymer is a salt such as an ammonium salt. Additionally, a copolymer of a monomer having a carboxylic acid group and a monomer having a salt of carboxylic acid, and a copolymer of a monomer having a carboxylic acid group, a monomer having a salt of carboxylic acid, and a derivative such as an alkyl ester of carboxylic acid are preferably used.

A polymer having an acrylic acid group or a group of its salt is particularly preferred. Specifically, polyacrylic acid, a polymer in which at least a part of a carboxylic acid group of polyacrylic acid is substituted with an ammonium salt of carboxylic acid (hereinafter referred to as ammonium polyacrylate), and the like are exemplified. In case where the polishing agent of the present invention contains an inorganic acid as a pH regulator, ammonium polyacrylate is particularly preferred in order to adjust a pH of the polishing agent to a range of 7 or less.

The water-soluble organic polymer having a carboxylic acid group and/or a salt of carboxylic acid has a weight average molecular weight of preferably from 1,000 to 50,000, and particularly preferably from 2,000 to 30,000. The content (content ratio or concentration) of the water-soluble organic polymer is preferably from 0.01 to 0.5 mass % based on the total amount of the polishing agent. In case where the content ratio of the water-soluble organic polymer is from 0.01 to 0.5 mass %, flatness in the polishing of a pattern substrate is satisfactory, and sufficient removal rate to a silicon oxide film is obtained.

Water-Soluble Polyamide

The water-soluble polyamide contained in the polishing agent of the present invention is a polyamide having a tertiary amino group and/or an oxyalkylene chain in the molecule thereof and having water solubility.

The water-soluble polyamide used in the present invention has water solubility imparted by a tertiary amino group and/or an oxyalkylene chain present in the molecule thereof. The tertiary amino group may be introduced into the main chain of the polyamide, may be bonded to the side chain thereof, and may be bonded to both the main chain and the side chain thereof. It is preferred that the oxyalkylene chain is introduced into the main chain of the polyamide.

Examples of the monomer compound for introducing the tertiary amino group into the main chain of the polyamide include aminoethyl piperazine and bisaminopropyl piperazine. Example of the monomer compound for introducing the tertiary amino group into the side chain of the polyamide includes α-dimethylamino-ε-caprolactam. The monomer compound for introducing the tertiary amino group into the main chain or side chain of the polyamide is hereinafter called an amino group-introducing monomer.

Example of the monomer compound for introducing an oxyalkylene chain into the main chain of the polyamide includes a modified polyalkylene glycol in which both terminals of a polyalkylene glycol are modified into diamine or dicarboxylic acid. Example of the modified polyalkylene glycol in which the both terminals are modified into diamine includes bisaminopropyl polyethylene glycol. Example of the modified polyalkylene glycol in which both terminals are modified into dicarboxylic acid includes biscarboxypolyethylene glycol.

When the modified polyalkylene glycol in which both terminals are modified into diamine is used, it is preferred to use dicarboxylic acid in an amount substantially equimolar to the modified polyalkylene glycol. Examples of the dicarboxylic acid used include adipic acid, sebacic acid, dodecanedicarboxylic acid, terephthalic acid and isophthalic acid. When the modified polyalkylene glycol in which both terminals are modified into dicarboxylic acid is used, it is preferred to use diamine in an amount substantially equimolar to the modified polyalkylene glycol. Examples of the diamine used include an aliphatic diamine such as hexamethylene diamine, methylpentadiamine and nonanediamine, an alicyclic diamine such as p-aminocyclohexylmethane, and an aromatic diamine such as meta-xylenediamine.

The water-soluble polyamide is obtained by homopolymerizing or copolymerizing the amino group-introducing monomer and the modified polyalkylene glycol, but a water-soluble polyamide obtained by the copolymerization in which lactams are further added is preferred. Specifically, a water-soluble polyamide obtained by copolymerizing at least one of the amino group-introducing monomer and the modified polyalkylene glycol, and lactams is preferred, and a water-soluble polyamide obtained by copolymerizing the amino group-introducing monomer, the modified polyalkylene glycol and lactams is more preferred.

Examples of the lactams include ε-caprolactam, propion lactam, heptane lactam, capryl lactam, undecane lactam and lauryl lactam.

The water-soluble polyamide is preferably a copolymer obtained from aminoethyl piperazine and/or modified polyalkylene glycol, and a lactam.

Commercially available product of the water-soluble polyamide includes water-soluble nylon (trade name: AQ NYLON) manufactured by Toray Industries, Inc.

The content (content ratio or concentration) of the water-soluble polyamide is preferably from 0.00005 to 0.01 mass % based on the total amount of the polishing agent. The content ratio of the water-soluble polyamide is more preferably from 0.0001 to 0.005 mass %, and particularly preferably from 0.0005 to 0.005 mass %. In case where the content ratio of the water-soluble polyamide is from 0.00005 to 0.01 mass %, sufficiently high removal rate to a silicon oxide film is obtained, and flatness in the polishing of a pattern substrate is satisfactory.

pH

The pH of the polishing agent of the present invention is 7 or less. When the pH of the polishing agent is 7 or less, the effects of improvement in removal rate to a silicon oxide film and improvement in flatness are sufficiently achieved, and dispersion stability of cerium oxide particles as abrasives are satisfactory. The pH of the polishing agent is more preferably from 4 to 6.5, and still more preferably 4.5 to 6.

Various inorganic acids or inorganic acid salts may be contained in the polishing agent of the present invention in order to adjust the pH thereof to a predetermined value of 7 or less. The inorganic acids or inorganic acid salts are not particularly limited, and, for example, nitric acid, sulfuric acid, hydrochloric acid, phosphoric acid, and their ammonium salts or potassium salts can be used. Various basic compounds may be added as a pH regulator to the polishing agent of the present invention. It is preferred that the basic compound is water-soluble, but the basic compound is not particularly limited to be water-soluble. Examples of the basic compound that can be used include ammonia, potassium hydroxide, quaternary ammonium hydroxide such as tetramethylammonium hydroxide and tetraethylammonium hydroxide, and organic amine such as monoethanolamine and ethylene diamine.

Other than the above components, a dispersant can be contained in the polishing agent of the present invention. The dispersant is contained to stably disperse cerium oxide particles in a dispersion medium such as pure water. Examples of the dispersant include anionic, cationic, non-ionic and amphoteric surfactants, and anionic, cationic, nonionic and amphoteric polymer compounds, and one or two or more of those can be contained. Furthermore, a lubricant, a thickener or viscosity regulator, a preservative and the like can be appropriately contained in the polishing agent of the present invention as necessary.

The polishing agent of the present invention may be prepared and used such that for the convenience of storage and transportation, a dispersion of cerium oxide particles (hereinafter referred to as a dispersion α) and an aqueous solution obtained by dissolving the water-soluble organic polymer having a carboxylic acid group and/or a salt of carboxylic acid and the water-soluble polyamide in water (hereinafter referred to as an aqueous solution β) are separately prepared as two liquids, and those are mixed when using. The aqueous solution β is a liquid additive for polishing described below.

Liquid Additive for Polishing

The liquid additive for polishing of the present invention is a liquid additive for preparing a polishing agent by mixing with a dispersion of cerium oxide particles (dispersion α described above), includes a water-soluble organic polymer having a carboxylic acid group and/or a salt of carboxylic acid, a water-soluble polyamide and water, and has the pH of 7 or less. When the liquid additive for polishing is used in the preparation of a polishing agent, convenience of storage and transportation of a polishing agent can be improved.

Each component of the water-soluble organic polymer having a carboxylic acid group and/or a salt of carboxylic acid, the water-soluble polyamide and water and the pH of the liquid, in the liquid additive for polishing of the present invention are the same as those described for the polishing agent.

In the liquid additive for polishing of the present invention, the content ratio (concentration) of the water-soluble organic polymer having a carboxylic acid group and/or a salt of carboxylic acid is not particularly limited. However, from the standpoints of easy handling of a liquid additive and easy mixing with a dispersion of cerium oxide particles, the content ratio thereof is preferably 0.002 to 50 mass % based on the total amount of the liquid additive.

In the liquid additive for polishing of the present invention, the content ratio (concentration) of the water-soluble polyamide is not particularly limited. However, from the standpoints of easy handling of a liquid additive and easy mixing with a dispersion of cerium oxide particles, the content ratio thereof is preferably 0.0001 to 60 mass % based on the total amount of the liquid additive.

The pH of the liquid additive for polishing of the present invention is 7 or less. When the pH of the liquid additive for polishing is 7 or less, by mixing with the dispersion of cerium oxide particles, the effects of improvement in removal rate of a silicon oxide film, improvement in flatness in the polishing of a pattern substrate, and the like are sufficiently obtained, and additionally, a polishing agent having satisfactory dispersion stability of cerium oxide particles as abrasives is obtained. The pH of the liquid additive for polishing is more preferably from 4 to 6.5, and particularly preferably from 4.5 to 6.

In the dispersion of cerium oxide particles to be mixed with the liquid additive for polishing, the content ratio (concentration) of the cerium oxide particles in the dispersion is preferably from 0.2 to 40 mass % from the standpoint of dispersibility of cerium oxide particles and easy handling of the dispersion. The content ratio thereof is more preferably from 1 to 20 mass %, and particularly preferably from 5 to 10 mass %.

When the liquid additive for polishing of the present invention is mixed with the dispersion of cerium oxide particles, the polishing agent having improved removal rate can be achieved while maintaining sufficiently high flatness to a silicon oxide film. In mixing the liquid additive for polishing with the dispersion of cerium oxide particles, the liquid additive for polishing may be added to and mixed with the dispersion of cerium oxide particles, and the dispersion of cerium oxide particles may be added to and mixed with the liquid additive for polishing.

The mixing ratio between the liquid additive for polishing and the dispersion of cerium oxide particles is not particularly limited, as long as the content ratios (concentrations) of the water-soluble organic polymer and water-soluble polyamide are from 0.01 to 0.5 mass % and from 0.00005 to 0.01 mass % based on the total amount of the polishing agent, respectively, in the polishing agent after mixing. It is preferred that the liquid additive for polishing and the dispersion of cerium oxide particles are mixed with each other in a mass ratio of liquid additive for polishing:dispersion of cerium oxide particles=130:1 to 1:130, from the standpoint of easy mixing of those.

When the dispersion of cerium oxide particles (dispersion α) and the liquid additive for polishing (aqueous solution β) of the present invention are separately prepared as two liquids, and those liquids are mixed with each other to prepare the polishing agent, those liquids are prepared such that the content ratio (concentration) of cerium oxide particles in the dispersion α and each concentration of the water-soluble organic polymer and water-soluble polyamide in the liquid additive for polishing (aqueous solution β) are concentrated to a concentration of 2 to 100 times the concentration when used as a polishing agent, those liquids thus concentrated are mixed with each other, and the resulting mixture is diluted when used as a polishing agent to achieve a given concentration. More specifically, for example, in the case where the dispersion α and the liquid additive for polishing are prepared such that the concentration of cerium oxide particles in the dispersion α and each concentration of the water-soluble organic polymer and water-soluble polyamide in the liquid additive for polishing are 10 times, the dispersion α, the liquid additive for polishing and water are mixed in the proportions of 10 parts by mass, 10 parts by mass and 80 parts by mass, respectively, and the resulting mixture is diluted to 10 times, thereby obtaining a polishing agent.

Preparation Method of Polishing Agent

To prepare the polishing agent of the present invention, for example, a method of adding the water-soluble organic polymer having a carboxylic acid group and/or a salt of carboxylic acid and the water-soluble polyamide to the dispersion obtained by dispersing the cerium oxide particles in water such as pure water or ion-exchanged water, followed by mixing is used. Uniform polishing agent can be obtained by stirring for a predetermined period of time using a stirrer or the like. Furthermore, further satisfactory dispersion state can be obtained by using an ultrasonic disperser after the mixing.

The polishing agent of the present invention is not always required to be provided in the polishing site as a mixture obtained by previously mixing all of constituent components. The polishing agent may have a desired composition having polishing components mixed, when providing in the polishing site.

Regarding the polishing agent of the present invention, for the convenience of storage and transportation, the dispersion of cerium oxide particles (dispersion α) and the liquid additive for polishing (aqueous solution β) are separately prepared as two liquids, and those may be mixed when using. In the case of separating into two liquids of the dispersion α and the aqueous solution β and mixing those to prepare the polishing agent, the concentrations of the water-soluble organic polymer and water-soluble polyamide in the aqueous solution β are concentrated into, for example, 10 times the concentrations when using the polishing agent, and the aqueous solution β may be diluted with water to obtain predetermined concentrations after mixing, and then used.

Polishing Method

The polishing method according to an embodiment of the present invention is a polishing method including bringing a polishing pad into contact with a surface to be polished of an object to be polished while supplying the polishing agent described above to perform the polishing by relative movement therebetween. The surface to be polished on which the polishing is performed is, for example, a surface which includes a surface including silicon dioxide of a semiconductor substrate. As the semiconductor substrate, the substrate for STI described above is exemplified as a preferred example. The polishing method of the present invention is effective in the polishing for flattening an interlayer insulating film between multilayer wirings in the manufacturing of a semiconductor device.

The silicon dioxide film in a substrate for STI includes a so-called PE-TEOS film obtained by film formation with a plasma CVD method using tetraethoxysilane (TEOS) as a raw material. The silicon dioxide film further includes a so-called HDP film obtained by film formation with a high density plasma CVD method. The silicon nitride film includes a film obtained by film formation with a low pressure CVD method or a plasma CVD method using silane or dichlorosilane, and ammonia as raw materials.

Flatness can be improved by performing the polishing by the above-described method using the polishing agent of the present invention. The evaluation of flatness is conducted using, for example, a pattern wafer for STI. The polishing of a pattern for STI is desirably stopped at the time that the silicon nitride film has been exposed, and it is advantageous for flatness as the silicon nitride film of a pattern wafer is not shaved.

In the present invention, a distance of from the upper surface of the silicon nitride film before polishing to the upper surface of the silicon nitride film of the concave part after polishing is used as an index of flatness in a pattern wafer, but the decreased amount of a film thickness of the silicon nitride film can be also used as an index of flatness.

The polishing method according to the embodiment of the present invention can use the conventional polishing machine. FIG. 2 is a view showing one example of a polishing machine usable in the polishing method of the present invention.

This polishing machine 20 includes a polishing head 22 for holding a semiconductor substrate 21 such as an STI substrate, a polishing platen 23, a polishing pad 24 stuck onto the surface of the polishing platen 23, and a polishing agent supply tube 26 for supplying a polishing agent 25 to the polishing pad 24. The polishing machine is constituted such that the surface to be polished of the semiconductor substrate 21 held by the polishing head 22 is brought into contact with the polishing pad 24 while supplying the polishing agent 25 from the polishing agent supply tube 26, and the polishing head 22 and the polishing platen 23 are relatively rotated to perform polishing. The polishing machine used in the embodiment of the present invention is not limited to this structure.

The polishing head 22 may perform not only rotation movement, but also linear movement. The polishing platen 23 and the polishing pad 24 may have a size equivalent to or smaller than the size of the semiconductor substrate 21. In this case, it is preferred to relatively move the polishing head 22 and the polishing platen 23, thereby making it possible to polish the entire surface of the surface to be polished of the semiconductor substrate 21. The polishing platen 23 and the polishing pad 24 may not perform rotation movement, but may move, for example, in one direction by a belt system.

The polishing conditions of the polishing machine 20 are not particularly limited. However, polishing pressure is increased by applying a load to the polishing head 22 to press the polishing head to the polishing pad 24, and, as a result, removal rate can be improved. The polishing pressure is preferably from about 0.5 to 50 pKa, and from the standpoints of uniformity of the removal rate in the surface to be polished of the semiconductor substrate 21, flatness and prevention of polishing defects such as scratches, the polishing pressure is more preferably from about 3 to 40 pKa. The number of rotations of the polishing platen 23 and the polishing head 22 is preferably from about 50 to 500 rpm, but is not limited to this range. The supply amount of the polishing agent 25 is appropriately adjusted by a composition of the polishing agent, polishing conditions described above, and the like.

As the polishing pad 24, a pad including a nonwoven fabric, a foamed polyurethane, a porous resin, a non-porous resin or the like may be used. To accelerate the supply of the polishing agent 25 to the polishing pad 24 or to allow a certain amount of the polishing agent 25 to stay in the polishing pad 24, groove processing such as a lattice shape, a concentric shape or a helical shape may be applied to the surface of the polishing pad 24. Furthermore, as necessary, a pad conditioner may be brought into contact with the surface of the polishing pad 24, and the polishing may be performed while conditioning the surface of the polishing pad 24.

According to the polishing method of the present invention, in CMP treatment such as flattening of an interlayer insulating film or flattening of an insulating film for STI in the manufacturing of a semiconductor device, the surface to be polished including silicon oxide (for example, silicon dioxide) can be polished in high removal rate, and additionally, high flatness can be achieved.

EXAMPLES

The present invention is specifically described below by reference to working examples and comparative examples, but the invention should not be construed as being limited to those examples.

Examples 1 to 10, 12 and 15 are working examples, and Examples 11, 13 and 14 are comparative examples. In the following examples, unless otherwise indicated, "%" means "mass %". Characteristic values were measured and evaluated by the following methods.

pH

The pH was measured using a pH meter MH-30R manufactured by DKK-TOA Corporation.

Average Secondary Particle Size

The average secondary particle size was measured using a laser diffraction/scattering particle size distribution analyzer (manufactured by Horiba, Ltd., device name: LA-920).

Polishing Characteristics

The polishing characteristics were measured and evaluated using a fully automatic CMP polishing machine (manufactured by Applied Materials, device name: Mirra). Two-layer pad (manufactured by Rodel, trade name: IC-1400, K-groove) was used as the polishing pad, and diamond pad conditioner (manufactured by 3M, trade name: A165) was used for conditioning the polishing pad. The polishing conditions were polishing pressure: 21 pKa, the number of rotations of polishing platen: 77 rpm, and the number of rotations of polishing head: 73 rpm. Furthermore, the supply rate of the polishing agent was 200 ml/min.

For the measurement of a removal rate, a silicon dioxide film-attached blanket substrate in which a silicon dioxide film has been formed on an 8-inch silicon wafer by plasma CVD using tetraethoxysilane as a raw material was used as a polishing object (an object to be polished).

For the evaluation of flatness of polishing, the commercially available STI pattern substrate for test (manufactured by International SEMATECH, trade name: 864CMP000) was used as the object to be polished.

In this pattern substrate, concave and convex patterns shaped like patterns of STI are formed on an 8-inch silicon wafer. Line & space patterns in which a width of each part is changed in a range of from 0.5 to 500 μm and concave parts and convex parts are alternately formed, and stripe patterns in which the sum of widths of the concave parts and the convex parts is 100 μm and the width of the convex part is changed in a range of from 10 to 90 μm are formed respectively as the patterns. The film thickness of the silicon nitride film formed as a polishing stopper layer on the convex part is 90 nm, and the depth of a trench is 350 nm. The entire surface of the pattern substrate is covered with a silicon dioxide film having a film thickness of 500 nm formed by plasma CVD using tetraethoxysilane as a raw material.

A film thickness meter UV-1280SE manufactured by KLA-Tencor was used for the measurement of a film thickness of a silicon dioxide film formed on the above-described blanket substrate and pattern substrate. In the blanket substrate, the removal rate was calculated by obtaining the difference between the film thickness of the silicon dioxide film before polishing and the film thickness thereof after polishing for 1 minute. An average value of the removal rate obtained from removal rates at 49 places on the surface of the substrate was obtained, and was used as the removal rate (angstrom/min) of the silicon dioxide film.

In the evaluation of flatness of polishing, the pattern substrate was polished until the silicon nitride film is exposed in the stripe pattern having a width of the convex part of 70 μm in a region that the total of widths of the concave parts and the convex parts is 100 μm, and the polishing was additionally performed for 30 seconds. In the pattern substrate after polishing, a distance d of from the upper surface of the silicon dioxide film of the convex part in the line & space patterns in which widths of the concave parts and the convex parts each are 50 μm, to a silicon layer, that is, a film thickness of the silicon dioxide film of the concave part, was measured with the method described above. The difference between the distance d and a standard value $d_0$ was obtained. Here, the standard value $d_0$ is as follows. The upper surface of the silicon nitride film before polishing is considered as a standard, and the sum (350 nm) of a distance of from the upper surface of the silicon nitride film before polishing to the silicon layer (this distance corresponds to a film thickness of the silicon nitride film before polishing, and is 90 nm), and a distance of from the center point of the lower surface of the silicon nitride film to a point at which a line drawn vertically to the lower surface of the silicon nitride film from the center point intersects with a line drawn in parallel from the bottom of a trench was used as a standard value. The difference ($d_0$–d) between the thus calculated distance d and the standard value $d_0$ is a distance of from the upper surface of the silicon nitride film before polishing to the upper surface of the silicon dioxide film of the concave part after polishing, and this value was used as an index of flatness.

Example 1

AQ Nylon P-95 (trade name, manufactured by Toray Industries, Inc.) (hereinafter referred to as "water-soluble polyamide A") was added to pure water such that the content ratio (concentration) thereof is 0.002% based on the total amount of a liquid additive, and ammonium polyacrylate having a weight average molecular weight of 5,000 was further added such that the concentration thereof is 0.106%. Thereafter, nitric acid was added to adjust the pH to 5. Thus, a liquid additive was obtained. 1,000 g of a cerium oxide dispersion having a concentration of 0.5% obtained by dispersing cerium oxide particles having an average secondary particle size of 0.10 μm in pure water was added to 1,000 g of the liquid additive, followed by stirring and mixing. Thus, a polishing agent (1) was obtained.

The content ratios (concentrations) of the water-soluble polyamide A, ammonium polyacrylate and cerium oxide particles are 0.001%, 0.0531% and 0.25%, respectively, based on the total amount of the polishing agent (1).

Example 2

A polishing agent (2) was obtained in the same manner as in Example 1, except that the liquid additive was prepared by adding AQ Nylon T-70 (trade name, manufactured by Toray Industries, Inc.) (hereinafter referred to as a "water-soluble polyamide B") in place of the water-soluble polyamide A to pure water such that the concentration thereof is 0.002% based on the total amount of the liquid additive.

Example 3

A polishing agent (3) was obtained in the same manner as in Example 1, except that the concentration of the water-soluble polyamide A is 0.0002% based on the total amount of the liquid additive and is 0.0001% based on the total amount of the polishing agent.

Example 4

A polishing agent (4) was obtained in the same manner as in Example 1, except that the concentration of the water-soluble polyamide A is 0.001% based on the total amount of the liquid additive and is 0.0005% based on the total amount of the polishing agent.

Example 5

A polishing agent (5) was obtained in the same manner as in Example 1, except that the concentration of the water-soluble polyamide A is 0.004% based on the total amount of the liquid additive and is 0.002% based on the total amount of the polishing agent.

Example 6

A polishing agent (6) was obtained in the same manner as in Example 1, except that the pH of the liquid additive is changed to 4.5.

Example 7

A polishing agent (7) was obtained in the same manner as in Example 1, except that the pH is adjusted to 5 by adding nitric acid and thereafter the pH is adjusted to 6 by adding KOH.

Example 8

A polishing agent (8) was obtained in the same manner as in Example 1, except that the concentration of the ammonium polyacrylate is 0.0426% based on the total amount of the liquid additive and is 0.0213% based on the total amount of the polishing agent.

Example 9

A polishing agent (9) was obtained in the same manner as in Example 1, except that the concentration of the ammonium polyacrylate is 0.17% based on the total amount of the liquid additive and is 0.085% based on the total amount of the polishing agent.

Example 10

A polishing agent (10) was obtained in the same manner as in Example 1, except that polyacrylic acid having a weight average molecular weight of 5,000 was used in place of the ammonium polyacrylate having a weight average molecular weight of 5,000.

Example 11

A polishing agent (11) was obtained in the same manner as in Example 1, except that the water-soluble polyamide A is not used in the preparation of the liquid additive, that is, the liquid additive is obtained by adding the ammonium polyacryate having a weight average molecular weight of 5,000 to pure water such that the concentration thereof is 0.0531% based on the total amount of the polishing agent (0.1062% based on the total amount of the liquid additive), and then adding nitric acid to adjust the pH to 5.

Example 12

A polishing agent (12) was obtained in the same manner as in Example 1, except that a cerium oxide dispersion obtained by dispersing cerium oxide particles having an average secondary particle size of 0.18 μm in pure water was used in place of the cerium oxide dispersion obtained by dispersing the cerium oxide particles having an average secondary particle size of 0.10 μm in pure water.

Example 13

A polishing agent (13) was obtained in the same manner as in Example 12, except that the water-soluble polyamide A is not used in the preparation of the liquid additive, that is, the liquid additive is obtained by adding ammonium polyacryate having a weight average molecular weight of 5,000 to pure water such that the concentration thereof is 0.0531% based on the total amount of the polishing agent (0.1062% based on the total amount of the liquid additive), and then adding nitric acid to adjust the pH to 5.

Example 14

AQ Nylon P-95 (water-soluble polyamide A) was added to pure water such that the content ratio (concentration) thereof is 0.002% based on the total amount of the liquid additive, and nitric acid is added to adjust pH to 5. Thus, a liquid additive was obtained. 1,000 g of a cerium oxide dispersion having a concentration of 0.5% obtained by dispersing cerium oxide particles having an average secondary particle size of 0.10 μm in pure water was added to 1,000 g of the liquid additive, followed by stirring and mixing. Thus, a polishing agent (14) was obtained.

The content ratios (concentrations) of the water-soluble polyamide A and cerium oxide particles are 0.001% and 0.25%, respectively, based on the total amount of the polishing agent (14).

Example 15

A polishing agent (15) was obtained in the same manner as in Example 1, except that the liquid additive is prepared by adding AQ Nylon P-70 (trade name, manufactured by Toray Industries, Inc.) (hereinafter referred to as a "water-soluble polyamide C") in place of the water-soluble polyamide A to pure water such that the concentration thereof is 0.002% based on the total amount of the liquid additive.

The composition and pH of the polishing agents (1) to (15) obtained in Examples 1 to 15 are shown in Table 1.

Polishing characteristics (removal rate of silicon dioxide film, and flatness of polishing) of the polishing agents (1) to (15) obtained in Examples 1 to 15 were measured by the respective methods described above. The measurement results are shown in Tables 2 and 3. Specifically, the polishing characteristics (removal rate of silicon dioxide film, and flatness of polishing) when the polishing agents (1) to (11), (14) and (15) containing the cerium oxide particles having an average secondary particle size of 0.10 μm were used are shown in Table 2, and the polishing characteristics (removal rate of silicon dioxide film, and flatness of polishing) when the polishing agents (12) and (13) containing the cerium oxide particles having an average secondary particle size of 0.18 µm were used are shown in Table 3.

It can be seen from Tables 1 and 2 that when polishing was performed using the polishing agents (1) to (10) and (15) of Examples 1 to 10 and 15, having a pH of 7 or less and containing cerium oxide particles having an average secondary particle size of 0.10 µm, polyacrylic acid or its

TABLE 1

| Example | Average secondary particle size of cerium oxide (µm) | Concentration of cerium oxide (mass %) | Water-soluble polyamide | Concentration of Water-soluble polyamide (mass %) | Water-soluble organic polymer | Concentration of water-soluble organic polymer (mass %) | pH regulator | pH |
|---|---|---|---|---|---|---|---|---|
| 1 | 0.10 | 0.25 | A | 0.001 | Ammonium polyacrylate | 0.0531 | Nitric acid | 5 |
| 2 | 0.10 | 0.25 | B | 0.001 | Ammonium polyacrylate | 0.0531 | Nitric acid | 5 |
| 3 | 0.10 | 0.25 | A | 0.0001 | Ammonium polyacrylate | 0.0531 | Nitric acid | 5 |
| 4 | 0.10 | 0.25 | A | 0.0005 | Ammonium polyacrylate | 0.0531 | Nitric acid | 5 |
| 5 | 0.10 | 0.25 | A | 0.002 | Ammonium polyacrylate | 0.0531 | Nitric acid | 5 |
| 6 | 0.10 | 0.25 | A | 0.001 | Ammonium polyacrylate | 0.0531 | Nitric acid | 4.5 |
| 7 | 0.10 | 0.25 | A | 0.001 | Ammonium polyacrylate | 0.0531 | Nitric acid + KOH | 6 |
| 8 | 0.10 | 0.25 | A | 0.001 | Ammonium polyacrylate | 0.0213 | Nitric acid | 5 |
| 9 | 0.10 | 0.25 | A | 0.001 | Ammonium polyacrylate | 0.085 | Nitric acid | 5 |
| 10 | 0.10 | 0.25 | A | 0.001 | Polyacrylic acid | 0.0531 | KOH | 5 |
| 11 | 0.10 | 0.25 | None | — | Ammonium polyacrylate | 0.0531 | Nitric acid | 5 |
| 12 | 0.18 | 0.25 | A | 0.001 | Ammonium polyacrylate | 0.0531 | Nitric acid | 5 |
| 13 | 0.18 | 0.25 | None | — | Ammonium polyacrylate | 0.0531 | Nitric acid | 5 |
| 14 | 0.10 | 0.25 | A | 0.001 | None | — | Nitric acid | 5 |
| 15 | 0.10 | 0.25 | C | 0.001 | Ammonium polyacrylate | 0.0531 | Nitric acid | 5 |

TABLE 2

| | Removal rate (Angstrom/min) | Flatness (Distance from upper surface of silicon nitride film before polishing to upper surface of silicon dioxide film of concave part) (Angstrom) |
|---|---|---|
| Example 1 | 1607 | 153 |
| Example 2 | 1521 | 133 |
| Example 3 | 1268 | 204 |
| Example 4 | 1510 | 163 |
| Example 5 | 1617 | 213 |
| Example 6 | 1005 | 356 |
| Example 7 | 1038 | 393 |
| Example 8 | 1800 | 362 |
| Example 9 | 1483 | 380 |
| Example 10 | 1581 | 327 |
| Example 11 | 650 | 473 |
| Example 14 | 3000 | 2300 |
| Example 15 | 1280 | 160 |

TABLE 3

| | Removal rate (Angstrom/min) | Flatness (Distance from upper surface of silicon nitride film before polishing to upper surface of silicon dioxide film of concave part) (Angstrom) |
|---|---|---|
| Example 12 | 1913 | 278 |
| Example 13 | 1500 | 321 | salt, a water-soluble polyamide having a tertiary amino group and/or an oxyalkylene chain in the molecule thereof, and water, flatness of the pattern substrate after polishing was sufficiently satisfactory, and high removal rate to the silicon dioxide film can be achieved.

On the other hand, it can be seen that when the polishing agent (11) of Example 11, containing cerium oxide particles having an average secondary particle size of 0.10 µm and a polyacrylate and not containing a water-soluble polyamide was used, removal rate to the silicon dioxide film was decreased, and additionally, flatness of the pattern substrate was deteriorated, as compared with Examples 1 to 10 and 15.

Furthermore, it can be seen that when the polishing agent (14) of Example 14, containing cerium oxide particles having an average secondary particle size of 0.10 µm and a water-soluble polyamide and not containing a polyacrylate was used, removal rate to the silicon dioxide film was high, but flatness of the pattern substrate was remarkably deteriorated, as compared with Examples 1 to 10 and 15.

It can be seen from Tables 1 and 3 that when polishing was performed using the polishing agent (12) of Example 12, having a pH of 7 or less and containing cerium oxide particles having an average secondary particle size of 0.18 µm, a polyacrylate, a water-soluble polyamide having a tertiary amino group and/or an oxyalkylene chain in the molecule thereof, and water, flatness of the pattern substrate after polishing was sufficiently satisfactory, and high removal rate to the silicon dioxide film can be achieved.

On the other hand, it can be seen that when the polishing agent (13) of Example 13, containing cerium oxide particles having an average secondary particle size of 0.18 μm and a polyacrylate and not containing a water-soluble polyamide was used, removal rate to the silicon dioxide film was decreased, and additionally, flatness of the pattern substrate was deteriorated, as compared with Example 12.

The present application is based on Japanese Patent Application No. 2015-019935 filed on Feb. 4, 2015 and Japanese Patent Application No. 2015-213883 filed on Oct. 30, 2015, and the contents are incorporated herein by reference.

According to the present invention, removal rate to a silicon oxide film can be improved while maintaining sufficiently high flatness in, for example, CMP of the surface to be polished which includes a surface including silicon oxide. Therefore, the polishing agent and polishing method of the present invention are suitable for flattening an insulating film for STI in the manufacturing of a semiconductor device.

1: Silicon substrate
2: Silicon nitride film
3: Trench
4: Silicon dioxide film
20: Polishing machine
21: Semiconductor substrate
22: Polishing head
23: Polishing platen
24: Polishing pad
25: Polishing agent
26: Polishing agent supply tube

What is claimed is:

1. A polishing agent comprising:
cerium oxide particles;
a water-soluble organic polymer having at least one selected from a carboxylic acid group and a salt of carboxylic acid;
a water-soluble polyamide having at least one selected from a tertiary amino group and an oxyalkylene chain in a molecule thereof; and
water,
wherein the polishing agent has a pH of 7 or less.

2. The polishing agent according to claim 1, wherein the water-soluble polyamide has the tertiary amino group in at least one selected from a main chain and a side chain thereof.

3. The polishing agent according to claim 1, wherein the water-soluble polyamide has the oxyalkylene chain in the main chain thereof.

4. The polishing agent according to claim 1, wherein the water-soluble polyamide is a copolymer obtained from at least one selected from aminoethyl piperazine and a modified polyalkylene glycol, and a lactam.

5. The polishing agent according to claim 1, wherein the water-soluble organic polymer contains at least one selected from polyacrylic acid and ammonium polyacrylate.

6. The polishing agent according to claim 1, wherein the water-soluble organic polymer has a weight average molecular weight of from 1,000 to 50,000.

7. The polishing agent according to claim 1, wherein the water-soluble polyamide is contained in an amount of from 0.00005 to 0.01 mass % based on a total amount of the polishing agent.

8. The polishing agent according to claim 1, wherein the water-soluble organic polymer is contained in an amount of from 0.01 to 0.5 mass % based on the total amount of the polishing agent.

9. The polishing agent according to claim 1, having the pH of from 4 to 6.5.

10. The polishing agent according to claim 1, wherein the cerium oxide particles have an average secondary particle size of from 0.01 to 0.5 μm.

11. The polishing agent according to claim 1, wherein the cerium oxide particles are contained in an amount of from 0.05 to 2 mass % based on the total amount of the polishing agent.

12. A polishing method comprising: bringing a polishing pad into contact with a surface to be polished while supplying a polishing agent to perform polishing by relative movement therebetween,
wherein the surface to be polished including a surface comprising silicon oxide of a semiconductor substrate is polished using the polishing agent according to claim 1 as the polishing agent.

13. A liquid additive for polishing, which is a liquid additive for preparing a polishing agent by mixing with a dispersion of cerium oxide particles, the liquid additive comprising:
a water-soluble organic polymer having at least one selected from a carboxylic acid group and a salt of carboxylic acid;
a water-soluble polyamide having at least one selected from a tertiary amino group and an oxyalkylene chain in a molecule thereof; and
water,
wherein the liquid additive has a pH of 7 or less.

14. The liquid additive for polishing according to claim 13, wherein the water-soluble polyamide has at least one selected from: the tertiary amino group bonded to at least one selected from a main chain and a side chain thereof; and the oxyalkylene chain bonded to the main chain thereof.

15. The liquid additive for polishing according to claim 13, wherein the water-soluble polyamide is a copolymer obtained from at least one selected from aminoethyl piperazine and a modified polyalkylene glycol, and a lactam.

16. The liquid additive for polishing according to claim 13, wherein the water-soluble organic polymer contains at least one selected from polyacrylic acid and ammonium polyacrylate.

* * * * *